United States Patent [19]

Sugimoto et al.

[11] Patent Number: 4,509,011
[45] Date of Patent: Apr. 2, 1985

[54] NUCLEAR MAGNETIC RESONANCE DIAGNOSTIC APPARATUS

[75] Inventors: Hiroshi Sugimoto, Tochigi; Kozo Satoh, Yokohama, both of Japan

[73] Assignee: Tokyo Shubaura Denki Kabushiki Kaisha, Japan

[21] Appl. No.: 373,627

[22] Filed: Apr. 30, 1982

[30] Foreign Application Priority Data

Apr. 30, 1981 [JP] Japan .................. 56-65914

[51] Int. Cl.³ ............................................. G01R 33/08
[52] U.S. Cl. ................................. 324/309; 324/318
[58] Field of Search ............ 324/300, 307, 309, 318

[56] References Cited

U.S. PATENT DOCUMENTS

| 4,021,726 | 5/1977  | Garroway et al. | 324/5 A   |
| 4,115,730 | 9/1978  | Mansfield       | 324/309   |
| 4,174,481 | 11/1979 | Liebetruth      | 250/445 T |
| 4,184,110 | 1/1980  | Hinshaw         | 324/0.5 R |
| 4,254,778 | 3/1981  | Clow et al.     | 128/653   |

Primary Examiner—Michael J. Tokar
Attorney, Agent, or Firm—Finnegan, Henderson, Farabow, Garrett & Dunner

[57] ABSTRACT

Nuclear magnetic resonance diagnostic apparatus including a magnet for generating a uniform static magnetic field, a first coil for generating a gradient magnetic field, a selective detector for detecting the free induction decay signals from the selective slice portion of an object, a current controller for controlling the current in the first coil to the shift the selective slice portion, a second coil for generating the gradient magnetic field direction in the selective plane of the object, a projection data producer for obtaining a one-directional projection data on the basis of the detected free induction signals, and an image synthesizer for producing the extensive one-directional projection of the specified atomic nuclei distribution in the object by placing a plurality of one-directional projection data.

8 Claims, 14 Drawing Figures

NUCLEAR MAGNETIC RESONANCE DIAGNOSTIC APPARATUS

FIELD OF THE INVENTION

This invention relates to nuclear magnetic resonance diagnostic apparatus in which the density distribution of specified atomic nuclei such as the atomic nuclei of hydrogen in certain tissues of a living body can be measured in a noninvasive manner from outside of the object utilizing nuclear magnetic resonance (NMR) phenomena to obtain useful information for medical diagnostic purposes.

BACKGROUND OF THE INVENTION

One example of conventional NMR diagnostic apparatus is described in U.S. Pat. No. 4,254,778.

First, a static magnetic field is generated by four electromagnetic coils C1 shown in FIGS. 1 (a) and (b), and a gradient magnetic field generated by gradient magnetic field coils C2, C3 and C4 shown in FIGS. 2 and 3 is superimposed on the static field. Coils C2, C3 and C4 are installed to be combined with coils C1.

Such a situation is schematically illustrated in FIG. 4. Initially, the static field Hzo due to coils C1 is applied to the object with the gradient field Gz due to coils C2. The gradient field Gz is established by flowing current in the reverse direction in a pair of coils of the Helmholtz type shown in FIG. 2. Therefore, the direction of its magnetic force lines is the same (the Z-direction) as that of the static field Hzo. Also, the strength of the gradient field is zero at the center plane between the two coils C2, and its absolute value increases linearly from the center plane to either side thereof, but the direction of the field strength is opposite one another.

Next, when a selective exciting pulse H1 having an appropriate frequency component is applied to the composite magnetic field through a pair of probe-head coils C5 shown in FIG. 5, resonance occurs only in a plane in which a resonance frequency determined by the local field due to the fields Hzo and GZ is equivalent to the frequency of the pulse H1. To the plane of resonance, a gradient magnetic field GR formed by a combination of the magnetic fields GX and GY is applied. Measured through coils C5 is a free induction decay (FID) signal which is Fourier transformed to obtain the projection data of density distribution of atomic nuclei, for example, hydrogen along the gradient field GR in the selected plane. If projection data along a variety of directions is obtained by shifting the gradient field GR direction, the hydrogen nuclei density distribution image in a slice of the object is reconstructed using well-known techniques of X-ray computed tomography.

On the other hand, the multi-sensitive point imaging technique is known as one technique which does not require the above-mentioned image reconstruction as in Hinshaw, Journal of Applied Physics, Vol. 47, No. 8, August 1976. Such a technique operates on the principle that the gradient magnetic field is oscillated by flowing an alternate current into the gradient field coils and in the meantime FID signals are continuously measured for integration, resulting in signals only on the center line in which the gradient field is not changed with time.

There are many cases in which it is difficult to perform precise diagnosis only with the information obtained by NMR diagnostic apparatus using recent medical diagnostic techniques. Therefore, in such cases it is necessary to perform diagnosis in association with an X-ray image, X-ray CT image, ultrasonic image, nuclear medicine image or the like.

It is insufficient to utilize only tomographic images due to the NMR apparatus, which images are those perpendicular to the body axis of the human subject. One-directional projection images which are those projected in the one direction, are needed for positioning in correspondence to other imaging means, for example, X-ray images utilized in a variety of fields. Further, it could be easily supposed that not only such a positioning but also an examination is established with the one-directional projection image because general X-ray radiographic images are used popularly for examination. Although the formation of tomographic images is being pursued in the present NMR techniques while acquiring one-directional projection images, it is not sufficiently developed. This is especially true using a method in which an object is mechanically shifted like one performed using a conventional X-ray CT apparatus, which has the following disadvantages: (a) measuring time is long; (b) it is insufficient if the subject suffers pain due to movement; (c) the blur of images due to the mechanical operation; and (d) even during measurement, if the object is shifted, blur is caused in images.

SUMMARY OF THE INVENTION

It is therefore an object of this invention to provide nuclear magnetic resonance diagnostic apparatus wherein the extensive projection image in any direction of the specified atomic nuclei density distribution in an object is obtained without mechanically shifting the object.

Briefly, this and other objects are achieved in accordance with a first aspect of the invention by nuclear magnetic resonance diagnostic apparatus for measuring the nuclear magnetic resonance of a specified atomic nucleus in an object, comprising a magnet apparatus for generating a a uniform static magnetic field, a first coil apparatus for generating a gradient magnetic field, selective detecting means for detecting the free induction decay signals as to the specified atomic nuclei in the slice portion of the object perpendicular to the direction of said static magnetic field after applying exciting signals to the object positioned in said combined magnetic field, a current control apparatus for controlling the value of current flowing in said first coil apparatus to shift the selected portion along in the direction of said static magnetic field, a second coil apparatus for generating the gradient magnetic field in the direction along the plane of said selected portion, means for obtaining the one-directional projecton data as to the specified atomic nuclei distribution in said selected portion by processing the free induction decay signals detected by said selective detecting means, image synthesizing means for producing the extensive one-directional projection image of the specified atomic nuclei distribution in the object, combining a plurality of one-directional projection data corresponding to the different selective planes, obtained by said producing means, in the order of the direction of said static magnetic field, and a display for depicting the one-directional projection image produced by said image synthesizing means.

DESCRIPTION OF THE PREFERRED EMBODIMENT

Figure 1A:
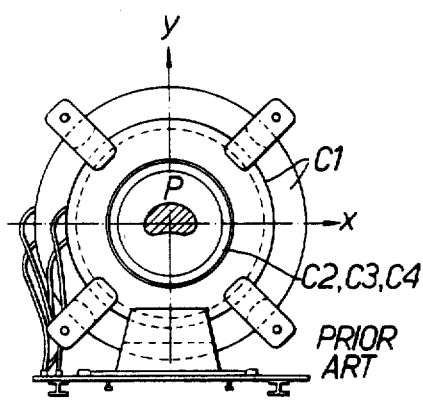
FIGS. 1 to 5 are schematic pictorial views for explaining the construction of a conventional apparatus.
Figure 1B:
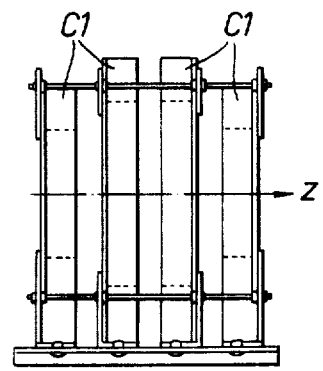
Figure 2:
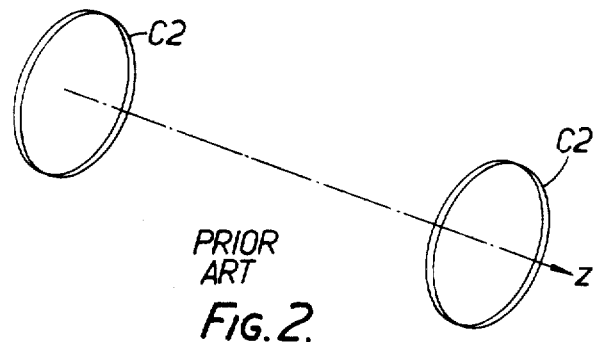
Figure 3:
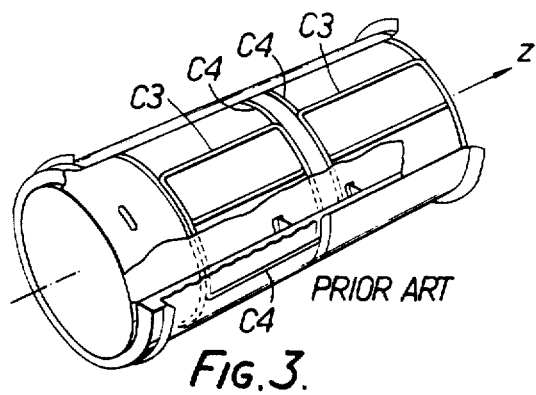
Figure 4:
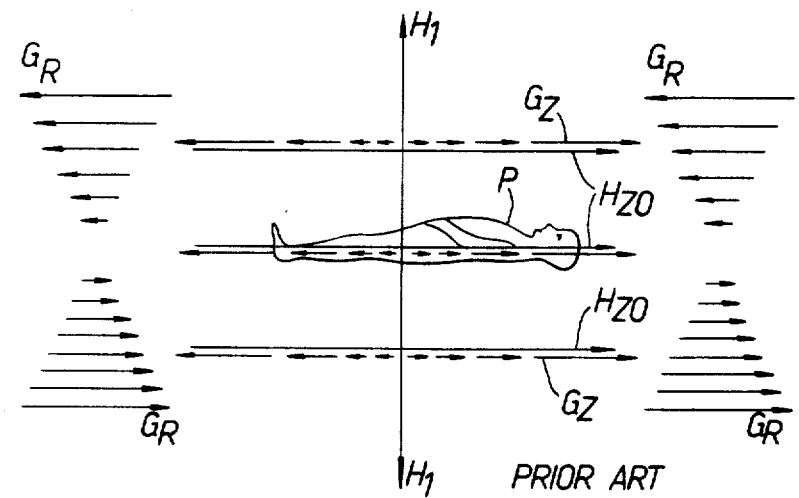
Figure 6:
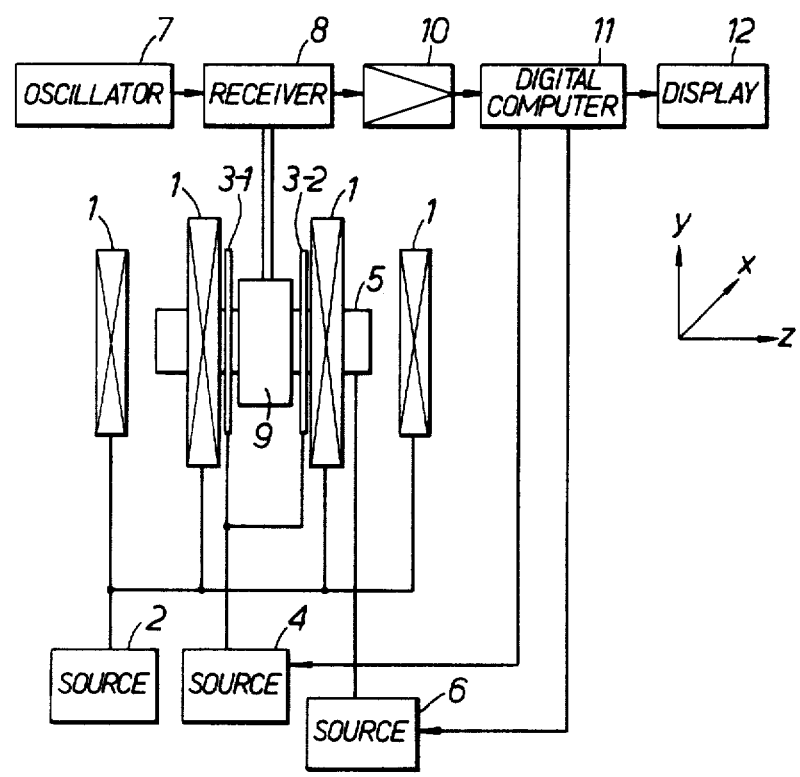
FIG. 6 is a schematic block diagram illustrating the construction of an embodiment of this invention.

Refering to FIG. 6, an electromagnet coil assembly having four coil elements 1 operates to form a uniform static magnetic field similar to coils C1 in FIGS. 1 (a) and (b). Each of the coils is connected to a D.C. source 2. A pair of coils 3-1 and 3-2 which are Helmholtz-type coils similar to coils C2 shown in FIG. 2, form a linear gradient field along the direction Z of the uniform static magnetic field. Connected to the coils 3-1 and 3-2 is a D.C. source 4 which is controlled by a digital computer 11 described hereinafter so as to change the value of current in each coil. Coils 5 which are saddle-type coils similar to coils C3 and C4 in FIG. 3, form a linear gradient magnetic field in the X and Y directions perpendicular to the Z direction of the static magnetic field. Connected to the coils 5 is a D.C. source 6 which is controlled by the computer 11 similar to the case for source 4.

Figure 5:
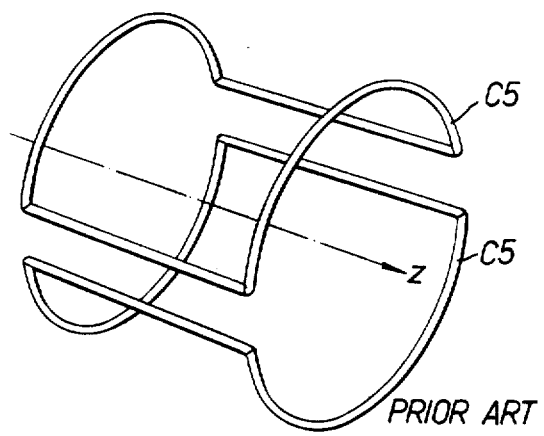

An oscillator 7 generates a selective exciting pulse which is supplied to so called bridge-type receiver 8 having a probehead 9 which is composed of similar coils to coils C5 shown in FIG. 5. An amplifier 10 amplifys a FID signal which is picked up by the probe-head 9.

Figure 7:
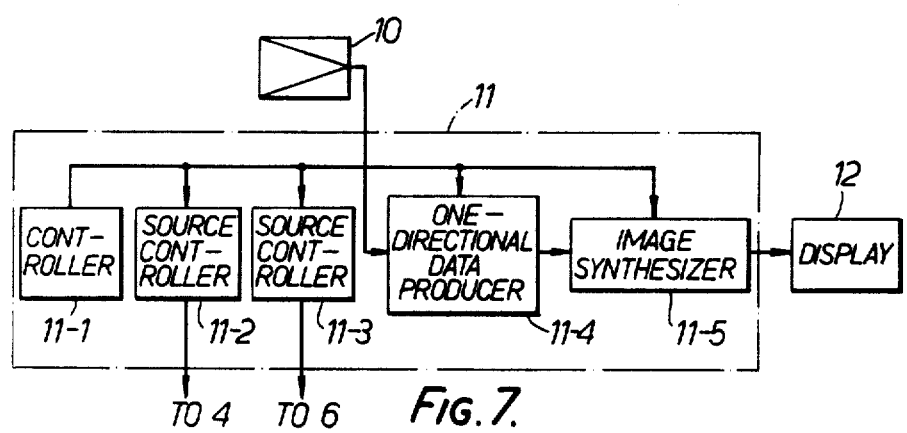
FIG. 7 is a schematic block diagram illustrating the construction of a digital computer included in the apparatus of FIG. 6.

A digital computer 11 which receives the FID signal is constituted as shown in FIG. 7. That is, a one-directional projection data producer 11-4 digitally transforms, stores and Fourier transforms after accumulation. An image synthesizer 11-5 produces a one-directional projection image from a number of onedirectional projection data of each different slice which are subsequently formed by the one-directional projection data producer 11-4. A controller 11-2 controls the source 4, a controller 11-3 the source 6 and a controller 11-1 the timing of all the system. A display 12 depicts the image acquired by the computer 11.

Figure 8:
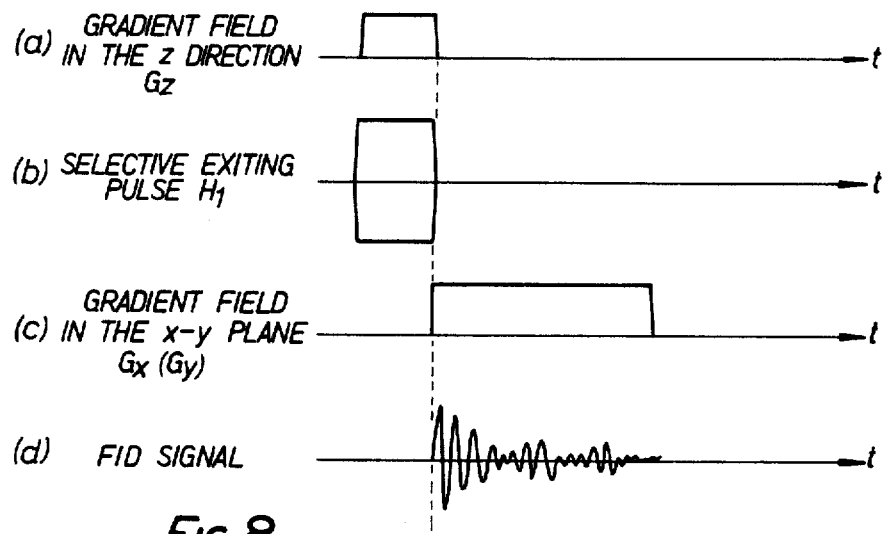
FIGS. 8 (a) to (d) are timing diagrams for explaining the operational sequence of the invention.

In operation, as shown in FIGS. 8 (a) and (b), the uniform static magnetic field HO is generated by the electromagnetic coils 1 and applied to the measuring region and then the gradient magnetic field GZ which is generated by coils 3 is applied in the Z direction. Also, a selective exciting pulse H1 is applied from the oscillator through bridge-type receiver 8 and probe-head 9 to the region. Here if the frequency of the selective exciting pulse is selected at the value f0 corresponding to the static field H0 with its frequency variation Δf, a portion between two planes corresponding to ±ΔGZ is determined by the equation $$\pi \Delta f = \gamma \Delta G Z$$

wherein $\gamma$ is a constant, the magnetogyric ratio characteristic of a particular type of nuclei, and the signal is selectively exciting the centering plane where the gradient magnetic field is zero.

After the selective exciting pulse, a gradient magnetic field in the X-Y plane (for simplification of explanation hereinafter, this gradient magnetic field is presumed one Gx in the X direction) is produced by coils 5, applied as shown in FIG. 8 (c) and a FID signal is measured as shown in FIG. 8 (d). This FID signal is received with receiver 8, amplified with amplifier 10, transformed to a digital value and Fourier transformed so that the image projected along the X-direction of the selected excited plane can be obtained.

Figure 9:
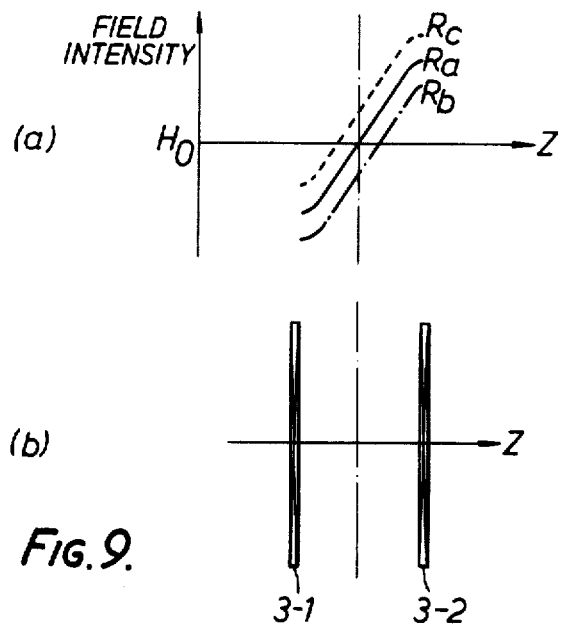
FIGS. 9 (a) and (b) are pictorial views for explaining the principle of selective portion scan of the invention.

Here, when current flows in coils 3-1 and 3-2 having the same value and opposite direction of flow, the intensity of magnetic field is zero at the centering point of coils 3-1 and 3-2 as shown by the characteristic curve Ra in FIGS. 9 (a) and (b), the selected plane being one including the centering point.

Subsequently, if the current in coil 3-2 is decreased and the curren in coil 3-1 is increased, the zero point of the field intensity is shifted toward coil 3-2 so that the selected plane shifts. Reversing the procedure, the zero point is shifted toward coil 3-1 as the curve Rc shows. Accordingly, by controlling source 4 with computer 11 the selected plane is subsequently shifted to obtain projection signals and an image-reconstruction is performed while correlating positions in the Z direction with the projection signals so that a one-directional projection image can be obtained. The resultant image may be depicted on a display 12.

In the above-mentioned embodiment, although only the projection in the x direction was described in respect to the X-Y plane, a projection image in the y direction may be obtained by applying a gradient magnetic field Gy in the y direction instead of the gradient field in the x direction. Also, for obtaining a projection image in a different direction in the X-Y plane a projection image in the direction of the vector sum can be necessarily obtained by appropriately selecting the value of the gradient magnetic fields Gx and Gy.

It will be apparent, to those skilled in the art, that modifications and variations can be made in the preferred embodiment disclosed herein without departing from the scope or the spirit of the invention.

Figure 10:
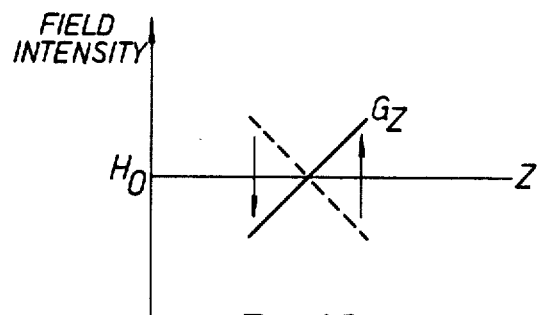
FIG. 10 is a pictorial view for explaining the principle of another embodiment of the invention.

For example, as a different embodiment from the above-mentioned system for selecting a plane perpendicular to the Z direction, there is a way to utilize the previously stated multi-sensitive point method without using a selective exciting pulse. That is, in this way, the D.C. source 4 in FIG. 6 is replaced with an A.C. source to apply A.C. current to coils 3-1 and 3-2. Thus, the linear gradient magnetic field Gz formed by coils 3-1 and 3-2 is, as shown in FIG. 10, oscillated about the point of magnetic intensity Ho. Subsequently, a 90° pulse is issued from oscillator 7 and the gradient magnetic field Gz may be unsynchronized. During the above procedure, the signals obtained are accumulated signals from the oscillating region and cancel each other; leaving only signals as to the plane of magnetic field intensity Ho. For shifting a selected plane, the current values in coils 3-1 and 3-2 may change by the control of source 4 similar to the selective exciting method described above.

Figure 11:
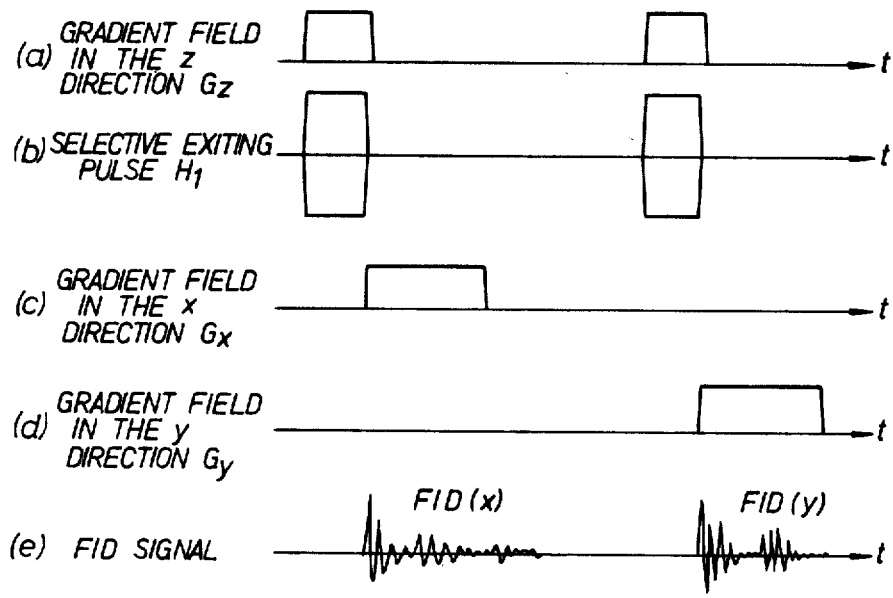
FIGS. 11 (a) to (e) are timing diagrams for explaining a further embodiment of the invention.

The projection images obtained by the above-stated embodiments are all one-directional while the one-directional projection image of an X-ray radiographic apparatus and X-ray CT apparatus are the same. It often occurs on an examination that a back-and-forth relationship of organs appearing in the same portion of one-directional projection image can be identified. In X-ray radiographic apparatus, an alternate radiograph in the two directions has often been performed using two pairs of X-ray tubes and detectors, which is called the "biplane method." The disadvantage of this method is that two pairs of apparatus are needed while in X-ray television apparatus and X-ray CT apparatus a similar disadvantage is present. On the contrary, in the NMR diagnostic apparatus according to the invention one-directional projection images can be obtained in the two directions with one apparatus, using the following method. That is, a gradient magnetic field, selective exciting pulse and the like are applied as clarified with time charts shown in FIGS. 11 (a) to (e). First, as shown in FIGS. 11 (a) and (b) the gradient magnetic field Gz in the Z direction and selective exciting pulse H1 are simulatneously applied to excite the selective plane. Next, as shown in FIG. 11 (c) the gradient magnetic field Gx in the x direction is generated to detect FID signals so that a FID signal FID (x) corresponding to a projection in the x direction can be obtained as shown in FIG. 11 (e). The gradient magnetic field Gz and selective exciting pulse H1 are again repeated to detect FID signals while causing a gradient magnetic field Gy in the y direction, the FID signal FID (y) corresponding to a projection signal in the y direction being obtained. In the selected planes, by repeating such procedure one-directional projection images in the two directions can be simultaneously obtained in one measuring operation. In this case, a multisensitive point method may be used instead of the selective exciting pulse method. Further, although the projecting directions are presumed to be the x and y directions for simplicity, one-directional projection images in any of the two directions in the x-y plane can be obtained by simultaneously applying gradient magnetic fields Gx and Gy in the x and y directions when FID signals are obtained.

In the above-mentioned embodiments, although the scan of selective planes is electrically performed by coils 3-1 and 3-2, in the case of measuring a one-directional projection image over a very long distance (for example, the legs, the whole body etc.) a scan distance more than the distance between coils 3-1 and 3-2 is needed. In such a case, a method to mechanically shift the bed portion on which the object is held, may be used for obtaining a one-directional projection image.

Figure 12:
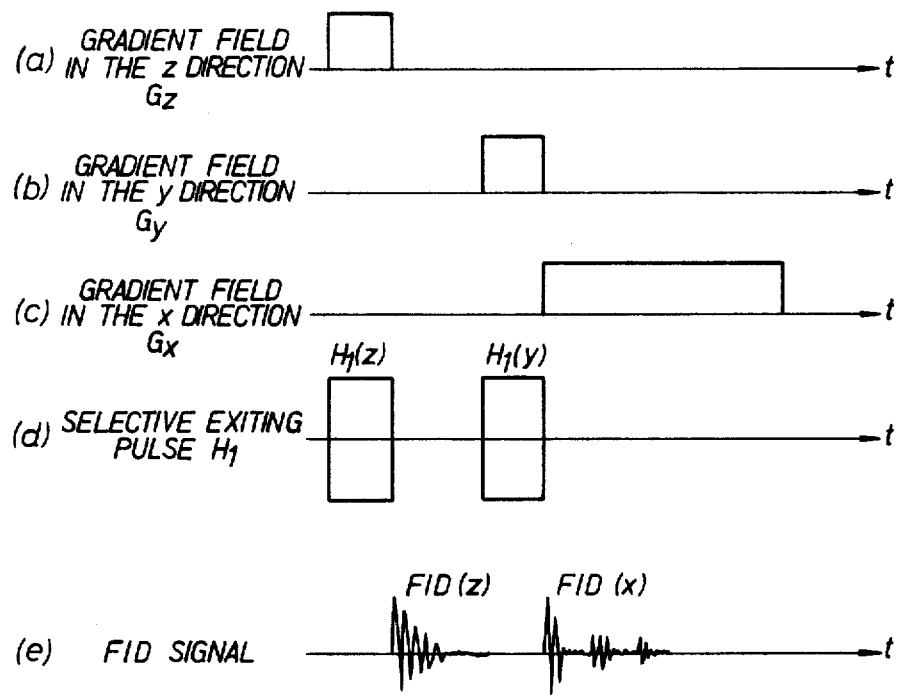
FIGS. 12 (a) to (e) and FIGS. 12 (a) to (c) are timing diagrams and pictorial views, respectively, for explaining yet another embodiment of the invention.
Figure 13:
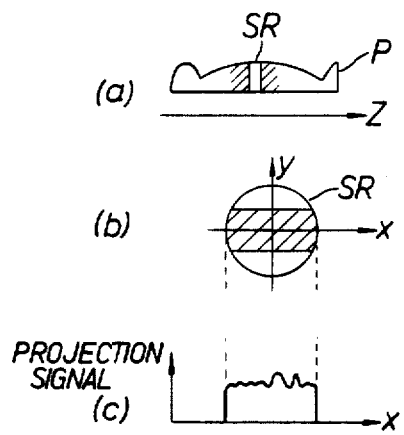

Also, with the above-mentioned embodiments, projection signals are obtained of all the hydrogen atomic nuclei in the selected plane. Although radiation-penetration type apparatus such as X-ray radiographic apparatus and X-ray CT apparatus must operate this way because of their constructional features, NMR diagnostic apparatus does not necessarily require all the projection signals. By combining the selective exciting pulse, and eliminating the hydrogen atomic nucleus signals from the portion not under examination, a one-directional projection image only in the region of interest can be obtained. Accordingly, it is possible to prevent the deterioration of density resolution due to the projection data from the regions of no interest mixed into the resultant image and slowing of the rate of identification because of the superimposition of organs. The timing chart of this method is shown in FIGS. 12 (a) to (e) and the principle view is in FIGS. 13 (a) to (c). A portion excluding the selective slice region SR is excited for saturation by a gradient magnetic field in the Z direction and by selective exciting pulse H1 (Z). Such a situation is shown in FIG. 13 (a) where oblique lines are drawn on the saturated portion. The FID signals FID(Z) in the portion are not measured. Next, only the specified portion in the y direction of the selective region SR is selectively excited by a gradient magnetic field Gy and selective exciting pulse H1(y). That situation is shown in FIG. 13 (b) where oblique lines are drawn on the exciting portion. A FID signal FID(x) is measured while a gradient magnetic field Gx is applied in the x direction. The projection signal obtained by the Fourier transformation of FID signal FID (x) is that of the hydrogen atomic nucleus density distribution of the oblique line portion in FIG. 13 (b) projected on the x axis, shown in FIG. 13 (c). Consequently, with the above procedure, a one-directional projection image of partition can be obtained.

What is claimed is:

1. Nuclear magnetic resonance diagnostic apparatus for measuring the nuclear magnetic resonance of a specified atomic nucleus in an object, the apparatus comprising:

a magnet apparatus for generating an uniform static magnetic field;

a first coil apparatus for generating a gradient magnetic field;

selective detecting means for detecting the free induction decay signals as to the specified atomic nuclei in a slice portion of the object perpendicular to the direction of said static magnetic field after applying exciting signals to the object positioned in said combined magnetic field;

a current control apparatus for controlling the value of current flowing in said first coil apparatus to shift the selected portion in the direction of said static magnetic field;

a second coil apparatus for generating a gradient magnetic field in the direction in the plane of said selected portion;

means for obtaining the one-directional projection data as to the specified atomic nuclei distribution in said selected portion by processing the free induction decay signals detected by said selective detecting means;

image synthesizing means for producing the extensive one-directional projection image of the specified atomic nuclei distribution in the object by placing a plurality of one-directional projection data corresponding to the different selective planes, obtained by said producing means, in order in the direction of said static magnetic field; and a display for depicting the one-directional projection image produced by said image synthesizing means.

2. The nuclear magnetic resonance diagnostic apparatus of claim 1 wherein said selective detecting means applies from an oscillator through a probe-head the selective exciting pulse for selectively exciting the specified atomic nuclei in the selected portion by the correlated operation with the gradient magnetic field due to the first coil apparatus, and detects the free induction decay signals with a receiver through said probe-head.

3. The nuclear magnetic resonance diagnostic apparatus of claim 1 wherein said selective detecting means selectively detects the free induction decay signals using an oscillator which generates 90° pulses by accumulating the free induction decay signals which are detected by exciting the object while energizing the first coil apparatus with alternating current.

4. The nuclear magnetic resonance diagnostic apparatus of any one of claims 1, 2 or 3 wherein said second coil apparatus include a coil to generate the gradient magnetic field in the direction along the selective plane and another coil to generate the gradient magnetic field perpendicular to the gradient magnetic field due to said other coil so that projection data in any direction along the selective plane are obtained by adjusting the gradient direction of the combined magnetic fields of both the gradient magnetic fields due to said coils of said second coil apparatus.

5. The nuclear magnetic resonance diagnostic apparatus of claim 4 wherein the gradient magnetic fields due to said two coils are alternately generated so that the projection images in two different directions are simultaneously obtained with one measurement procedure.

6. The nuclear magnetic resonance diagnostic apparatus of any one of claims 1, 2 or 3 further including a holder for said object and wherein the shifting of the selective portion is performed in combination with the electrical shifting of said portion and mechanical shifting of said object holder.

7. The nuclear magnetic resonance diagnostic apparatus of claim 2 wherein a portion excluding the selective slice portion is saturated by selective exciting and then only a portion of the selective portion is selectively excited, obtaining the projection image of that portion.

8. A method of obtaining a nuclear magnetic resonance spin density distribution of an object comprising the steps of:
   a. maintaining a static magnetic field along one axis;
   b. applying a first magnetic field gradient to said static magnetic field to cause said field to vary along said one axis;
   c. at the same time as applying said first magnetic field gradient, applying a selective excitation pulse along an axis orthogonal to said one axis so as to select at least one planar layer in the object normal to said one axis;
   d. removing said first magnetic field gradient and said selective excitation pulse;
   e. applying a second and a third magnetic field gradient to said static magnetic field, said second magnetic field gradient being orthogonal to said third magnetic field gradient, and to cause said second and said third magnetic field gradients to vary along axes which are orthogonal to said one axis thereby exciting a one-directional projection image strip in said planar layer; and
   f. at the same time as applying said second and said third magnetic field gradients, reading out the resulting free induction decay (FID) signal from said strip.

* * * * *